INVENTOR
BERTRAM H. GREENSPAN

BY Karl L. Spivak

ATTORNEY

INVENTOR
BERTRAM H. GREENSPAN

INVENTOR
BERTRAM H. GREENSPAN
BY Karl L. Spivak
ATTORNEY 3,626,575

PRINTED CIRCUIT BOARD EXTRACTOR TOOL

Bertram H. Greenspan, 112 Delia Lane,
Philadelphia, Pa. 19115

Filed Aug. 4, 1969, Ser. No. 847,193
Int. Cl. B25b *27/00*
U.S. Cl. 29—203 H 2 Claims

ABSTRACT OF THE DISCLOSURE

An extractor tool for removing slide captivated printed circuit boards from a connector housing including a frame of generally U-shaped configuration having a pair of spaced side flanges joined at one end thereof in a connecting web of variable width and having a slide of generally U-shaped configuration in sliding engagement within the said frame, the said slide terminating forwardly in a pair of circuit board affixing pins and the said frame terminating forwardly in a pair of spaced housing contacting stops whereby the spacing between the said pins may be varied by adjusting the width of the connecting web and whereby the distance between the pins and the stops may be varied by pulling the slide with respect to the connecting web. The extractor tool urges a printed circuit board forwardly with respect to its associated connector housing by positioning the pins within openings in the printed circuit board and the stops against stationary housing construction and then pulling the slide with respect to the web to apply extraction forces at the openings.

BACKGROUND OF THE INVENTION

This invention relates in general to the art of hand operated extractor tools, and more particularly, is directed to a tool capable of easily and quickly slidingly removing printed circuit boards from the associated connector housing.

There has always been a need to efficiently extract printed circuit boards that are slide captivated from various electronic devices such as the single black box type or the computer type console. It is presently the usual practice to grip the exposed edge of the printed circuit board by some means and then pull the board relative to the housing to thereby slidingly remove the board. Prior workers in the field have found that this method will ultimately fracture the edge of the board and thereby also cause associated damage to the board connected components and wiring.

Other prior workers have attempted to conveniently remove the printed circuit board by inserting a wire through the corner holes which are usually provided and then simply pull the wire by hand. This latter method is far from being professional in approach or technically oriented and on many occasions has led to serious defects such as bent connectors, broken circuit panel boards and other injurious results.

SUMMARY OF THE INVENTION

In order to solve the problem, the applicant has developed a circuit board extractor tool of the push-pull type which is capable of being universally adapted for use with printed circuit boards of various widths and is easily and readily adjustable for use with all presently used printed circuit boards that are slide oriented. The unique push-pull action between the frame stops and the slide pins exerts a straight and even extraction pressure on the board to thereby disengage the board from its mating connector without any damage whatsoever to either the board or the connector. The extractor tool as herein disclosed is highly efficient in operation and all forces generated are applied directly to the task, thereby minimizing physical exertion and eliminating the possibility of injury to the operator. The tool applies equal extraction force to each hole of the printed circuit board and thus prevents angular rotation of the board with respect to the connector.

It is therefore an object of this invention to provide an improved printed circuit board extractor tool of the type set forth.

It is another object of this invention to provide a printed circuit board extractor tool designed to function quickly and easily to separate a printed circuit board from its associated housing.

It is another object of this invention to provide a novel printed circuit board extractor tool that is capable of ready adjustment for operation with printed circuit boards of varying sizes.

It is another object of this invention to provide a novel printed circuit board extractor tool that may conveniently be efficiently operated using only one hand.

It is another object of the present invention to provide a novel printed circuit board extractor tool that is rugged in construction, simple in design and trouble-free when in use.

Other objects and a fuller understanding of the invention will be had by referring to the following description and claims of a preferred embodiment thereof, taken in conjunction with the accompanying drawings wherein like reference characters refer to similar parts throughout the several views and in which:

DESCRIPTION OF THE PREFERRED EMBODIMENT OF THE INVENTION

Figure 2:
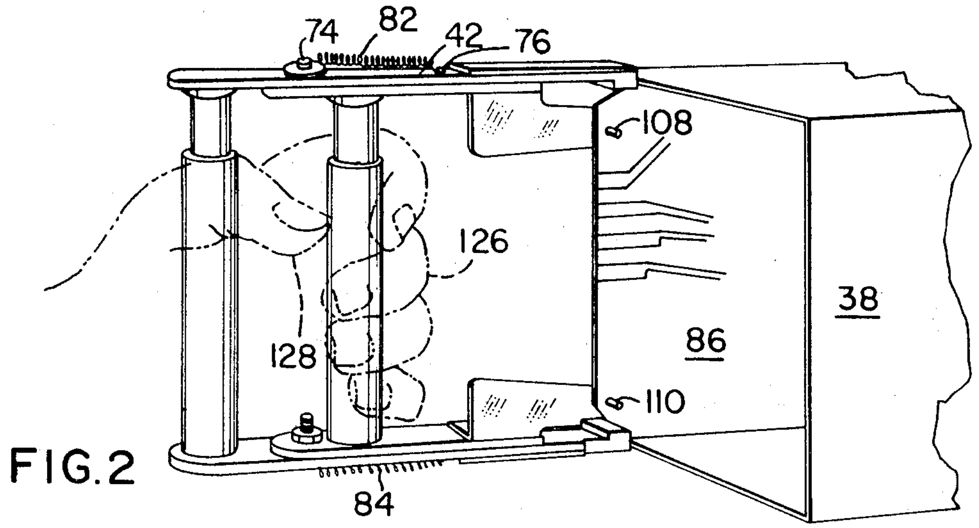
FIG. 2 is a perspective view of the tool of FIG. 1, showing the tool in use pulling a circuit board from its associated connector.

Although specific terms are used in the following description for the sake of clarity, these terms are intended to refer only to the particular structure of my invention selected for illustration in the drawings and are not intended to define or limit the scope of the invention.

Figures 1, 3:
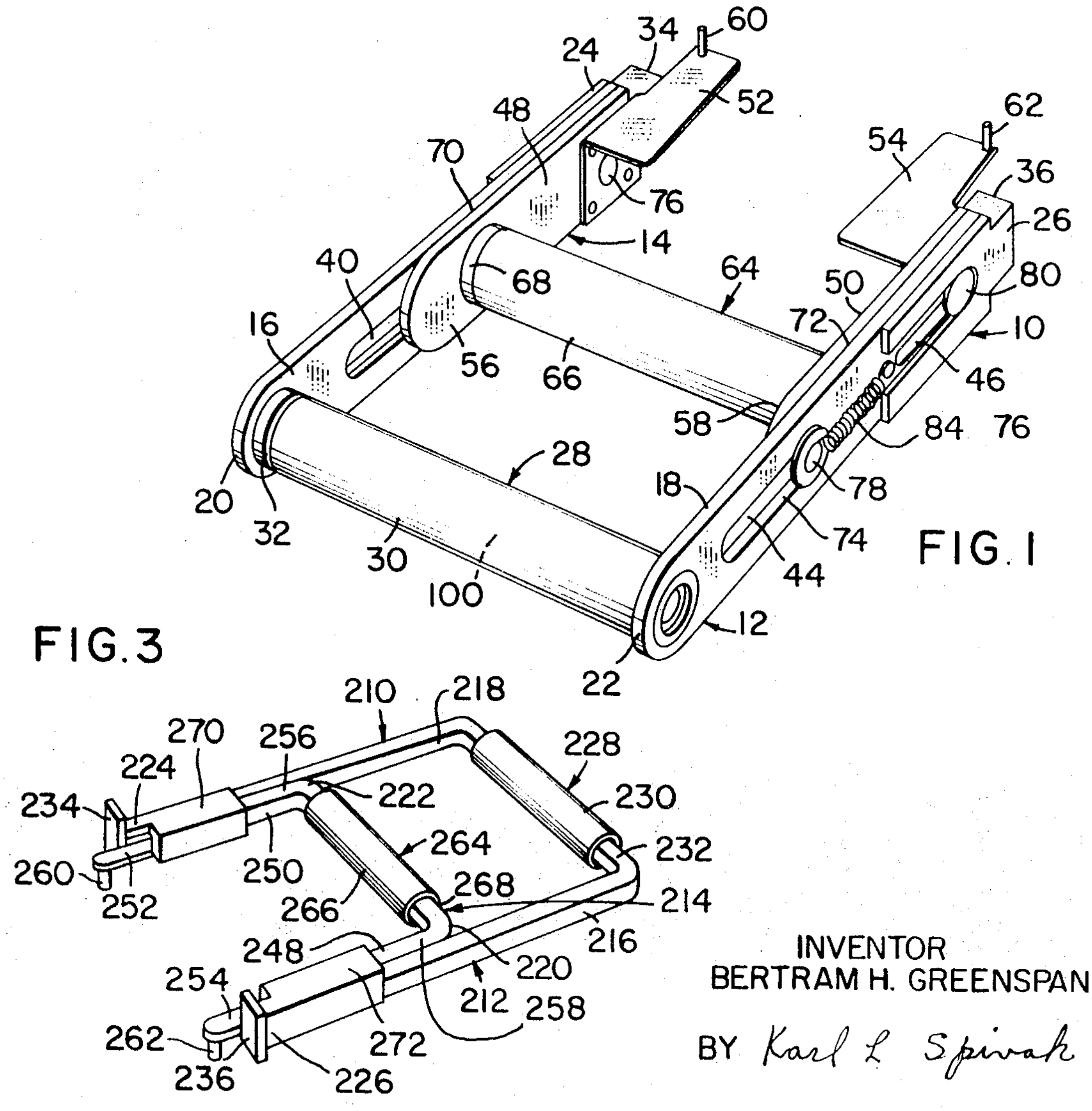
FIG. 1 is a perspective view of a printed circuit board extractor tool constructed in accordance with the present invention.
FIG. 3 is a perspective view of a modified printed circuit board extractor tool.

Referring now to the drawings, I show in FIG. 1 a printed circuit board extractor tool generally designated 10 comprising a widenable, generally U-shaped frame portion 12 and a widenable, generally U-shaped slide portion 14 which is retained in sliding engagement within the frame 12.

The frame portion 12 includes a pair of flat, spaced side flanges 16, 18 each of which respectively have a grip end 20, 22 and a free end 24, 26. The flanges 16, 18 widenably join together through the connecting web means 28 which include an exterior cylindrical barrel 30 rigidly affixed at one end thereof to the flange grip end 22. A plunger 32 rigidly affixes at right angles to the flange grip end 20 and telescopes within the barrel 30 to thereby permit the flanges 16, 18 to move in spaced parallel relation to each other for pin space adjusting purposes as hereinafter more fully set forth. Each side flange 16, 18 terminates forwardly in a housing contacting stop 34, 35 which positions upon the housing or computer type console 38 in stationary relationship for printed circuit board extraction purposes. The stops may also bear against adjacent panels if the housing is not accessible. Spring means 100 positioned within the connecting web means 28 may be provided to bias between the plunger 32 and the cylindrical barrel 30 to thereby urge the tool 10 to its narrowest position as illustrated in FIG. 1. The side flanges 16, 18 longitudinally open to provide the slide engaging slots 40, 42, 44, 46 which function to slidingly receive the slide portion 14 therein as hereinafter more fully set forth.

The slide 14 comprises a pair of spaced side legs 48, 50 each of which respectively terminates forwardly in a pin construction end 52, 54 and rearwardly in a handle end 56, 58. A pair of printed circuit board engaging pins 60, 62 project at right angles from the pin construction ends 52, 54 to engage within the circuit board openings as hereinafter more fully explained. The handle assembly 64 comprises a cylindrical barrel 66 affixed to one end thereof to the slide handle end 58 and a plunger 68 which affixes at one end thereof to the slide handle end 56. The plunger 68 telescopes within the barrel 66 to thereby permit the slide legs 48, 50 to widen in conjunction with the operation of the associated frame side flanges 16, 18.

Slide mount means 70, 72 comprises the longitudinally extending slots 40, 42, 44, 46 and the slide legs affixed pins 74, 76, 78, 80 which slidingly engage within the slots to thereby permit the slide portion 14 to slide relative to the frame portion 12. It should be noted that the pins 60, 62 move together with the slide portion 14 and with respect to the frame portion affixed stops 34, 36. The springs 82, 84 each respectively affix at one end to the frame side flanges 16, 18 and at the other ends thereof to the slide affixed pins 74, 78 to thereby bias the slide portion 14 forwardly with respect to the frame portion 12. It should be noted that the pins 60, 62 normally project forwardly of the stops 34, 36 to thereby facilitate engagement within the openings of the printed circuit board 86.

Figure 4:
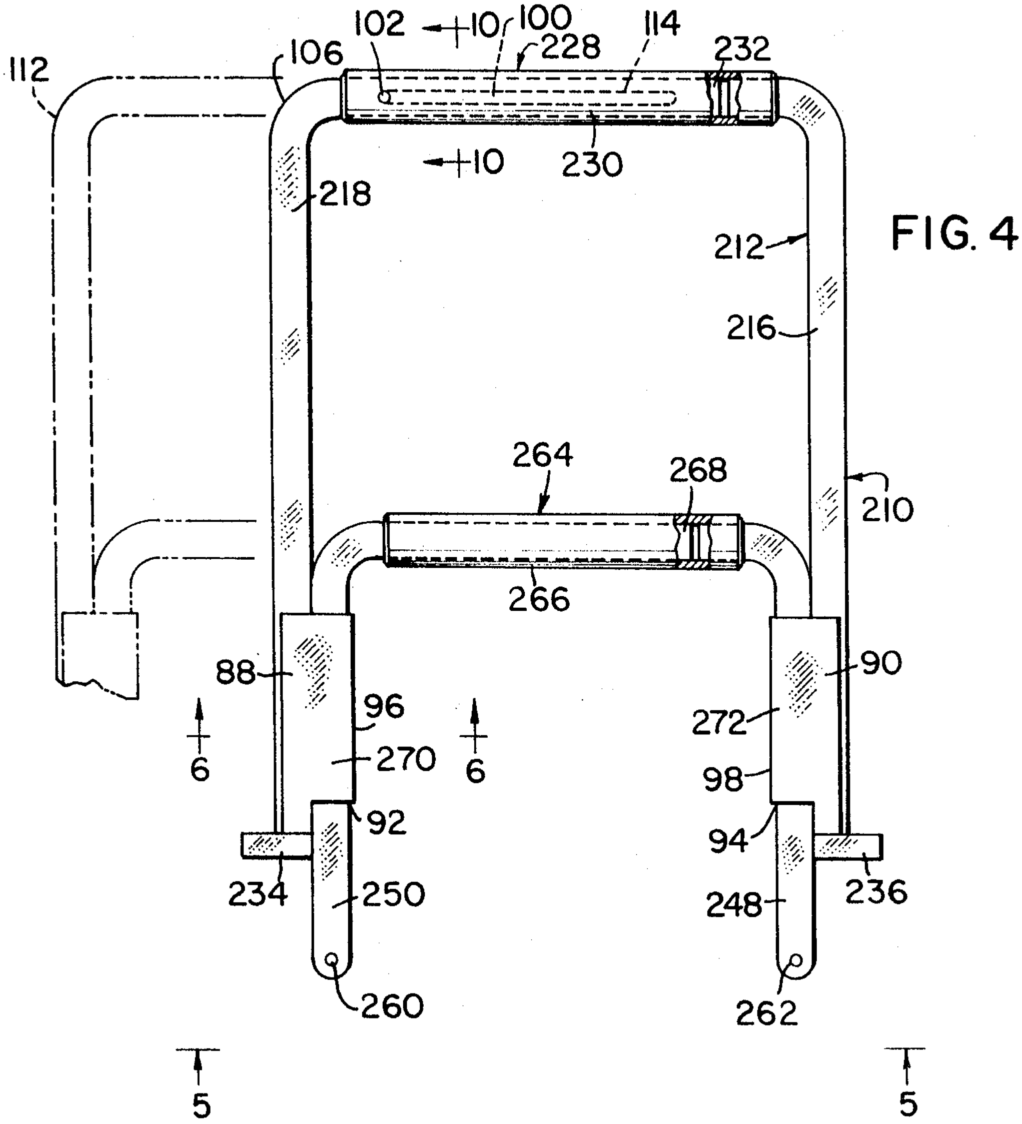
FIG. 4 is a top plan view of the modification of FIG. 3, the dotted lines indicating the extended position.
Figure 5:
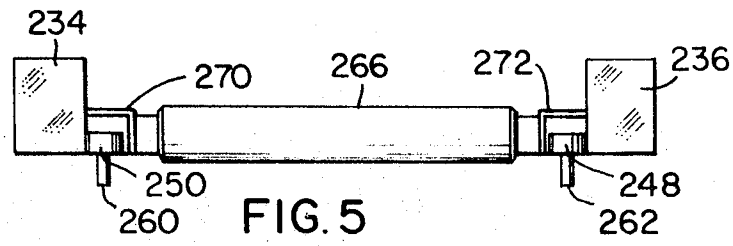
FIG. 5 is an end elevational view taken along line 5—5 of FIG. 4, looking in the direction of the arrows.

Referring now to FIGS. 3, 4 and 5, I show a modified type of printed circuit board extractor tool 210 which is similar in construction and operation to the extractor tool 10. For purposes of identification, similar parts have been designated with similar numbers with the exception that 200 has been added to each number. Thus part number 12 in FIG. 1 will be designated part number 212 in FIGS. 3 and 4.

In the embodiment of FIGS. 3 and 4, the slide mount means 270, 272 comprise generally channel-shaped members having the free ends of the channel flanges 88, 90 brazed or otherwise affixed to the frame side flanges 216, 218 to thus provide passages 92, 94 between the respective channel webs 96, 98 of the slide mount means 270, 272 to slidingly receive the slide side legs 248, 250 therein. The slide mount means 270, 272 thus serve to retain the slide portion 214 in sliding engagement within the frame portion 212.

Figure 6:
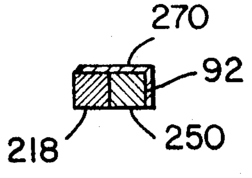
FIG. 6 is a cross-sectional view, taken along line 6—6 of FIG. 4, looking in the direction of the arrows.

Referring now to FIGS. 4 and 6, the retaining pin 102 inwardly projects from the barrel 230 and rides within the transverse plunger slot 114 to thereby prevent disengagement of the plunger 228 from the barrel 230 when the tool is pulled from the closed position 106 to the open position 112 illustrated in broken lines in FIG. 4. When necessary to engage the printed circuit board openings 108, 110 which are spaced wider apart, the side flanges 216, may be pulled to an open position 112 as illustrated by the dotted line position in FIG. 4. The pin 102 slidingly positions within the slot 114 and thus serves to prevent separation of the parts.

Figure 8:
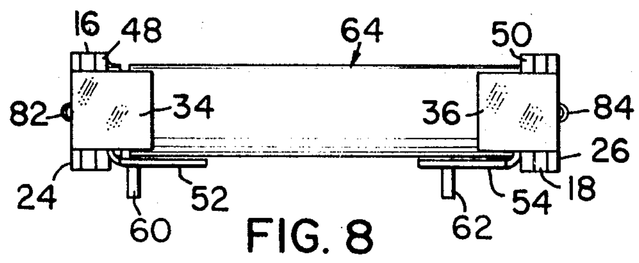
FIG. 8 is an end elevational view taken along line 8—8 of FIG. 7, looking in the direction of the arrows.
Figure 10:
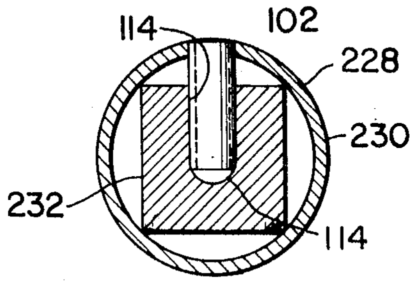
FIG. 10 is a cross sectional view taken along line 10—10 of FIG. 4, looking in the direction of the arrows.
Figure 7:
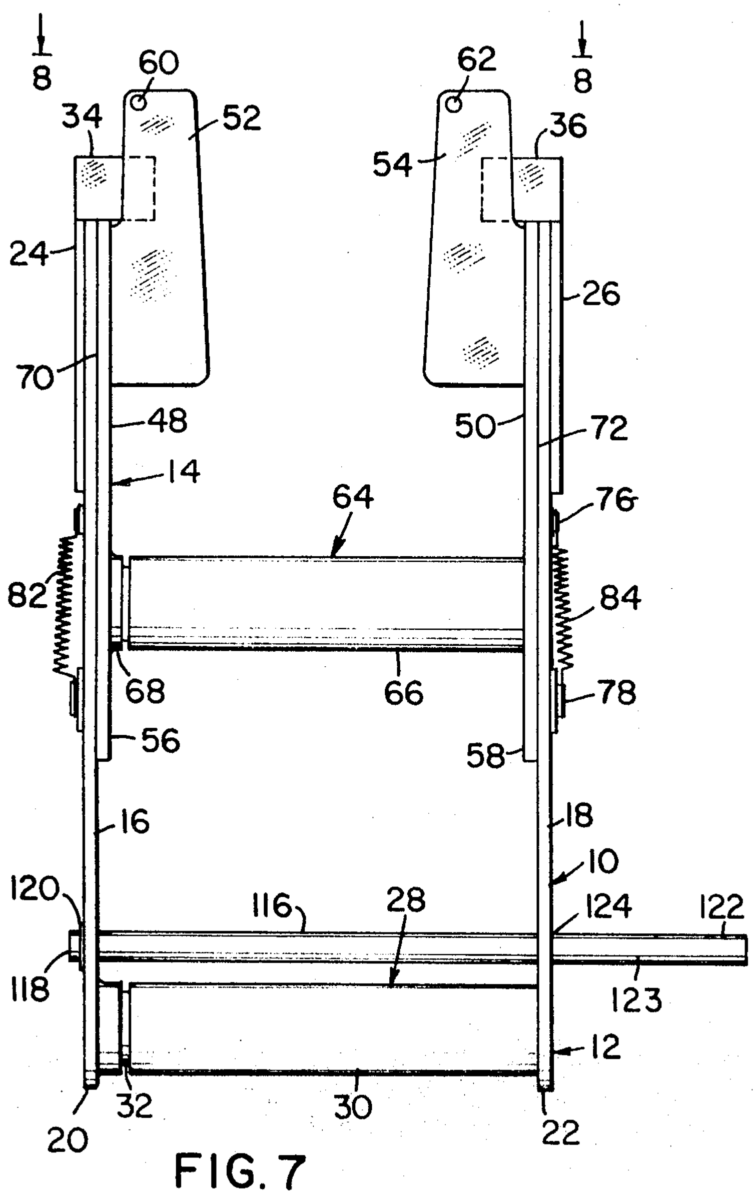
FIG. 7 is a bottom plan view of a modification of the invention similar to FIG. 1 including a manually operated plunger.
Figure 9:
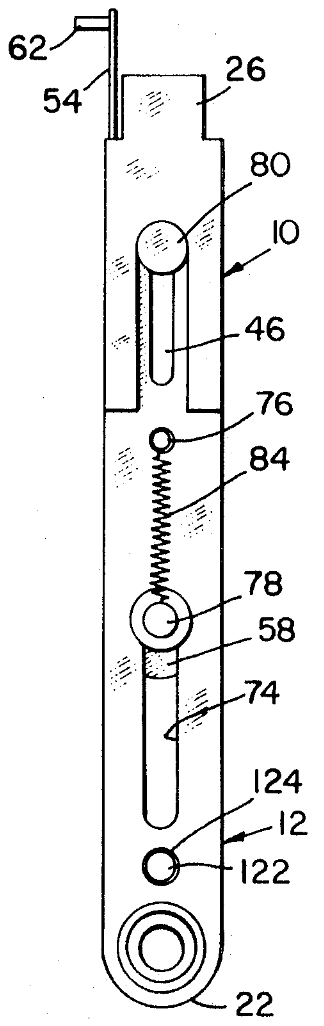
FIG. 9 is a side elevational view of the embodiment illustrated in FIG. 7.

In the embodiment illustrated in FIGS. 7–9, the extractor tool 10 is identical in construction to the embodiment illustrated in FIGS. 1 and 2 with the exception that a transverse push rod 116 has been employed to facilitate separating the pins 60, 62 for engaging the openings 108, 110 of the printed circuit board 86. The push rod 116 is secured to the side flange 16 in well-known manner such as by a threaded bolt 118 and washer 120. The push rod 116 positions transverse to the major axis of the extraction tool 10 in parallel, spaced relationship with the connecting web means 28. The free end 122 of the push rod inserts through the opening 124 provided through the side flange 18 to provide an exposed operating extension 123. Thus the pins 60, 62 may readily be urged apart by grasping the cylindrical barrels 30, 66 between the thumb and fingers on one hand 126. The thumb 128 pushes against the free end 122 of the push rod to thereby urge their respective plungers and barrels 32, 30 and 66, 68 apart against the bias of the internal spring 100 provided in the connecting web means 28.

In order to use my invention, the side flanges 16, 18 are urged apart against the bias of the transverse spring 100 either by pulling the flanges apart as in the embodiment illustrated in FIG. 1 or by pushing the side flanges apart as in the embodiment illustrated in FIG. 7 by utilizing the push rod 116. The side flanges 216, 218 are simply pulled apart to the desired distance in the embodiment illustrated in FIG. 3. Accordingly, the pins 60, 62 or 260, 262 spread apart a sufficient distance to engage within the openings 108, 110 provided in the printed circuit board 86. With the pins positioned within the openings 108, 110, the housing contacting stops 34, 36 or 234, 236 are positioned against stationary portions of the console or housing 38 or against an adjacent circuit board. With the stops thus positioned, the slide portion 14 or 214 is rearwardly pulled by squeezing the slide handles 64 or 264 rearwardly towards the respective connecting web means 28 or 228 by action of the hand 126 of the user.

In this manner, a steady, direct and straight extracting force may be applied to the printed circuit board 86 to thereby slidingly remove the printed circuit board from the housing or console 38. It should be noted that all forces generated by the extractor tools 10, 210 function directly at the pins 60, 62 or 260, 262 and are applied directly to the printed circuit board 86. Thus the forces generated by the tool are efficiently utilized without undue exertion on the part of the user. Further, it should be noted that all forces are applied directly in alignment with a plane drawn through the tool side flanges and are thus applied in exact alignment with the printed circuit board 36. In this manner, the possibility of the formation of side force vectors is completely eliminated and thus possible damage to the printed circuit board 36 or the holes 108, 110 through the improper application of extraction forces is essentially eliminated.

I claim:

1. In an extractor tool suitable for sliding a printed circuit board relative to its associated housing by engaging within spaced holes provided in the said printed circuit board, the combination of (A) a frame of generally U-shaped configuration, (1) said frame including a pair of spaced side flanges each having a grip end and a free end, (a) each said flange carrying slide mount means, (b) each said flange terminating at the said free ends thereof in a housing contacting stop, and (2) connecting web means extendably joining the said flange grip ends and including, (a) a cylindrical barrel affixed at one end thereof to one of said flange grip ends, (b) a plunger affixed at one end thereof to the other said flange grip end, the said plunger telescoping within the said barrel, and (c) spring means biasing between the said barrel and the said plunger;

(B) a slide of generally U-shaped configuration in sliding engagement with the said frame, said slide including a pair of spaced side legs each having a handle end and a pin end, (a) each said slide leg respectively sliding within one said slide mount means, (b) the said handle ends being extendably joined together by the handle grip means, (c) each said side leg carying at the pin end thereof a projecting pin, the said pins being insertable within the said printed circuit board holes.

2. The invention of claim 1 wherein the spring means act to pull the said side flanges together.

References Cited

UNITED STATES PATENTS

| | | | |
|---|---|---|---|
| 2,687,568 | 8/1954 | Keiser | 29—278 |
| 3,110,960 | 11/1963 | Rondash | 29—278 |
| 3,137,065 | 6/1964 | Harris | 29—278 |
| 3,461,534 | 8/1969 | Greenspan | 29—206 |

GRANVILLE Y. CUSTER, Jr., Primary Examiner